(12) United States Patent
Gerhard et al.

(10) Patent No.: US 10,437,667 B2
(45) Date of Patent: Oct. 8, 2019

(54) RAID SYSTEM PERFORMANCE ENHANCEMENT USING COMPRESSED DATA

(71) Applicant: International Business Machines Corporation, Armonk, NY (US)

(72) Inventors: Adrian C. Gerhard, Rochester, MN (US); Daniel F. Moertl, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 227 days.

(21) Appl. No.: 15/083,333

(22) Filed: Mar. 29, 2016

(65) Prior Publication Data
US 2017/0286215 A1    Oct. 5, 2017

(51) Int. Cl.
G11C 29/00    (2006.01)
G06F 11/10    (2006.01)
G11C 29/52    (2006.01)
G06F 3/06    (2006.01)

(52) U.S. Cl.
CPC ......... G06F 11/1068 (2013.01); G06F 3/064 (2013.01); G06F 3/0619 (2013.01); G06F 3/0688 (2013.01); G06F 3/0689 (2013.01); G11C 29/52 (2013.01)

(58) Field of Classification Search
CPC ...... G06F 11/10; G06F 11/1068; G06F 11/14; G06F 12/02; G06F 12/08; G06F 12/10; G06F 17/30; G06F 3/06; G06F 3/0619; G06F 3/064; G06F 3/0688; G06F 3/0689; G11C 29/52

USPC ........................................................ 714/766
See application file for complete search history.

(56) References Cited

U.S. PATENT DOCUMENTS

| | | | |
|---|---|---|---|
| 6,883,079 B1 | 4/2005 | Priborsky | |
| 8,037,244 B2 | 10/2011 | Muto et al. | |
| 8,407,378 B2 | 3/2013 | Marulkar | |
| 8,838,890 B2 | 9/2014 | Gupta | |

(Continued)

OTHER PUBLICATIONS

Gerhard, et al., "Raid System Performance Enhancement Using Compressed Data and Byte Addressable Storage Devices," U.S. Appl. No. 15/083,327, filed Mar. 29, 2016.

(Continued)

*Primary Examiner* — Albert Decady
*Assistant Examiner* — Enamul M Kabir
(74) *Attorney, Agent, or Firm* — Peter Edwards

(57) ABSTRACT

A method for operating a storage system RAID storage devices includes receiving a first data block to write to the storage system. The method further includes compressing the first data block to generate a second data block, the second data block including the first data block in compressed form and a data value indicating that the second data block is compressed. The method further includes storing the second data block in memory. The method additionally includes retrieving the second data block from memory and executing RAID operations to write the data block to the RAID storage devices, the set of operations including: generating, based on the second data block, redundant data for performing at least one of an error detection and an error correction operation on the second data block; writing the second data block to the RAID storage devices; writing the redundant data block to the RAID storage devices.

20 Claims, 5 Drawing Sheets

(56) References Cited

U.S. PATENT DOCUMENTS

| | | | |
|---|---|---|---|
| 9,332,090 B1* | 5/2016 | Fallows | H04L 67/02 |
| 2011/0317547 A1* | 12/2011 | Baudoin | H04L 65/607 |
| | | | 370/216 |
| 2013/0282953 A1* | 10/2013 | Orme | G06F 12/0238 |
| | | | 711/102 |
| 2013/0290615 A1* | 10/2013 | Shah | G06F 3/0608 |
| | | | 711/103 |
| 2014/0101514 A1* | 4/2014 | Cho | G06F 11/1012 |
| | | | 714/758 |
| 2014/0317340 A1* | 10/2014 | Nishina | G06F 3/0608 |
| | | | 711/103 |
| 2015/0058576 A1 | 2/2015 | Galbraith et al. | |
| 2015/0106563 A1* | 4/2015 | Hsu-Hung | G06F 3/0614 |
| | | | 711/114 |
| 2015/0199151 A1 | 7/2015 | Klemm et al. | |
| 2016/0011938 A1* | 1/2016 | Koseki | G06F 12/04 |
| | | | 714/766 |
| 2016/0306574 A1* | 10/2016 | Friedman | G06F 3/0619 |
| 2016/0350250 A1* | 12/2016 | Vasudevan | G06F 13/4282 |

OTHER PUBLICATIONS

List of IBM Patents or Patent Applications Treated as Related, Dated Mar. 24, 2016, 2 pages.

* cited by examiner

RAID SYSTEM PERFORMANCE ENHANCEMENT USING COMPRESSED DATA

BACKGROUND

The present disclosure relates to data storage systems, and more specifically, to using compressed data within a RAID storage system to improve performance.

Storage systems may use redundant arrays of independent disks (RAID) to provide fault tolerance, increase storage capacity, and to improve the performance of storage devices. These storage systems employ disk striping and disk mirroring techniques to redundantly distribute data amongst the array of disks. RAID storage systems may include storage controller, logically situated between the host computing systems and a set of RAID storage devices (disks), having a memory and data processing capabilities for processing data storage requests from host computing system.

SUMMARY

According to embodiments of the present disclosure, a method for operating a storage system, the storage system having memory and RAID storage devices may include receiving, from a computing system, a first data block to write to the storage system. The method may further include compressing the received first data block to generate a second data block, the second data block including the first data block in compressed form and a data value, where the data value indicates that the second data block is compressed. The method may further include storing the second data block in memory. The method may additionally include retrieving the second data block from memory and executing a set of RAID operations to write the second data block to the RAID storage devices, the set of operations including: generating, based on the second data block, redundant data for performing at least one of an error detection and an error correction operation on the second data block; writing the second data block to the RAID storage devices; and writing the redundant data block to the RAID storage devices.

Various embodiments are directed towards a system and a computer program product for operating a storage system.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
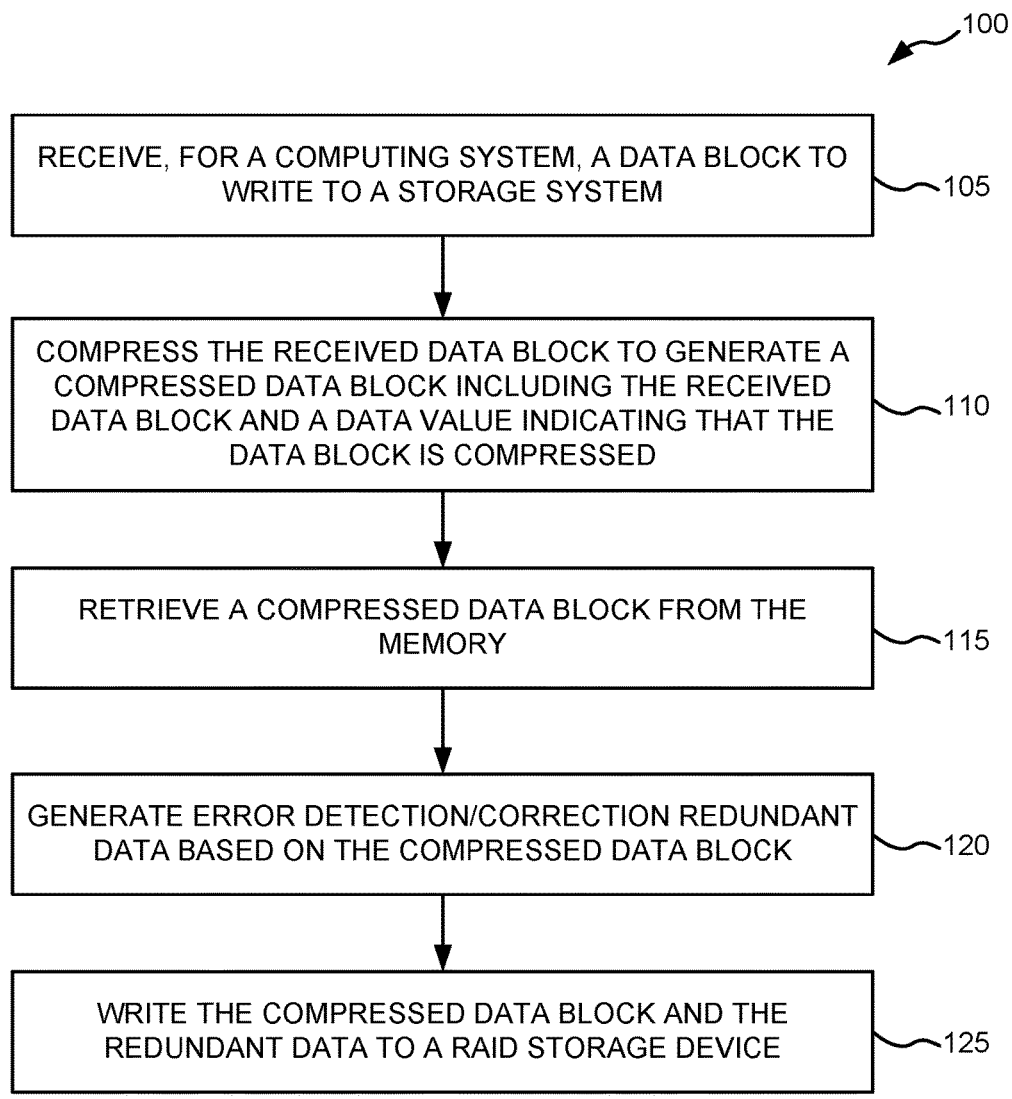
FIG. 1 depicts a flowchart of a set of computer implemented operations for processing data in a RAID storage system in response to a data write request, according to various embodiments.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to data storage systems, more particular aspects relate to using compressed data within a RAID storage system to improve performance. While the present disclosure is not necessarily limited to such applications, various aspects of the disclosure may be appreciated through a discussion of various examples using this context.

A RAID based storage system's (hereinafter "storage system") performance may be limited by the storage system's memory and bandwidth. A storage system's memory bandwidth, storage device interface bandwidth, and the amount of physical memory included in the storage system may be proportional to the storage system's performance. This relationship may be further appreciated by examining the architecture of certain RAID storage systems (e.g., RAID 5 and RAID 6 storage systems). These storage systems use memory to store data, control information, and to provide temporary buffers for the execution of internal storage operations. An artifact of this architecture is that a single storage system access request from a host computing system involving a block of data may require several memory accesses, and may utilize significantly more memory than is required to physically store the single data block. A partial stripe write of a block of data to a RAID 5 storage system, for example, may require six memory accesses, four storage device interface accesses, and the utilization of multiple temporary buffers. These resource accesses may be required to buffer the received data block, generate updated redundant data (e.g., parity data), and write both the received data block and redundant data to the storage system or a storage device associated with the storage system. An artifact of these repeated accesses to memory and storage device interfaces may be that each storage system operation may have a multiplicative effect on the utilization rate of the storage system's memory and storage interface buses. This in turn may create both memory and storage device interface bottlenecks which may limit the performance of storage systems.

Embodiments of the present disclosure are based on the recognition that configuring storage systems to perform internal operation on compressed data may reduce required memory to perform internal operations, lower bandwidth utilization rates, and improve performance of the storage systems. The present disclosure provides an architecture for improving the performance of RAID storage systems by configuring the storage system to execute internal data processing operations using compressed data. According to the architecture, when a data block received by a storage system from a host computing system it is compressed, as it is retrieved from a data communication bus, to generate a compressed data block. A data value indicating that the data block is compressed may be added to the compressed data block to obviate the need for generating tables to track compressed data. The compressed data block may then be temporarily stored in a memory (e.g., a non-volatile cache). At a later time, the compressed data block may be retrieved from the memory, and redundant data based on the compressed data block may be generated for error detection and correction. The compressed data block and redundant data may then be written to a storage device in a full or partial stripe write operation. A full stripe write of multiple compressed data blocks may include identifying the size of the largest compressed data block out of a set of two or more compressed data blocks, and padding the remaining blocks in the set with, for example, zeros to increase their size to match or equal the size of the largest compressed data block. The redundant data may be generated to correspond with each padded compressed data block. For a partial stripe write, redundant data may be generated to correspond with just the compressed data block. The compressed data blocks (or padded compressed data blocks) and corresponding redundant information may then be written to specified RAID storage devices.

The architecture may further configure RAID storage systems to retrieve compressed data from RAID storage devices and store (or cache) the retrieved compressed data in memory without decompression. Additionally, the architecture may configure the storage system to read compressed data from a RAID storage device, decompress the compressed data, and transmit the decompressed data to a computing system without buffering or storing the decompressed data in the storage system's memory.

As used herein, a data unit or unit of data may be any quantifiable unit for measuring, counting, partitioning, or representing electronic data. A data unit for example may be a byte, a word, a block, and a sector.

As used herein, a data block may be a collection of one or more units of data logically represented as a single unit for, e.g., storage, transmission, manipulation. A data block, for example, may be a logical collection 4096 bytes of data. A size of a data block may be the number units of data in the collection.

As used herein, a compressed data block may refer to the compressed form of the data block. An example of a compressed data block may be a data block that has been transformed through a computer implemented algorithm to reduce the number of data units required to represent that data block in a memory (e.g., in an electronic memory such as a dynamic random access memory, DRAM) of a computing or a storage system. A compressed data block may have a physical size and a logical size. The physical size may be the number of units of data required to represent the compressed data block in an electronic memory. The logical size may be the number of units of data required to represent the uncompressed or expanded data (e.g., the number of units of data that was compressed to form the compressed data block) in an electronic memory. Compressed data and a compressed data block carry the same meaning and may be used interchangeably herein. Decompressed data refers to the expanded or decompressed form of data block.

A stripe may be a logical division or association of data or storage space across a set (e.g., one or more) of RAID storage devices. When a stripe spans two or more storage devices, the stripe may include data blocks (or other logical or physical storage units) that occupy the same logical or physical space on the two or more RAID storage devices. A single stripe spanning the RAID storage devices may include three 4 kilobyte (KB) blocks of data, with each 4 KB block of data being stored, respectively, at a physical or logical address (e.g., address 0x10000000) on each of the RAID storage devices. The data blocks within a stripe may be treated as a single logical entity for performance, error correction, and detection purposes. Redundant data (e.g., parity data), for example may be generated for each stripe and stored on one or more storage devices. In the present example, a fourth storage device may store redundant data corresponding with the three 4 KB blocks of the example stripe in a 4 KB block at address 0x10000000.

To illustrate some features of the present disclosure, consider an example storage system having storage devices (e.g., hard disk drives and solid state drives) that are formatted to, for example, 512 byte sectors (e.g., a drive sector). The example storage system may issue write operations using one or more 4 KB blocks, with each 4 KB corresponding to 8 drive sectors. According to the present disclosure each 4 KB may be compressed into a compressed data block. The compressed data block may be padded to ensure that the compressed data block fills an integral number of drive sectors. Consequently, a host 4 KB block may be compressed into an integer number of 1 to 8 driver sectors. A single host 4 KB block, for example, may be compressed to 512 bytes (e.g., a compressed data block filling a single drive sector). The 512 bytes may be written to a storage device, or operated on by the storage system, without padding. In another example, a single 4 KB block may be compressed to 513 bytes. According to the present disclosure, the 513 bytes may be padded to increase its size to fill two drive sectors. The padded compressed data block may then be written to a storage device, or operated on by the storage system.

Some features of the present disclosure may improve storage system performance during RAID5 and RAID6 partial writes. RAID5 partial writes may require 2 internal read operations and 2 internal write operations, as described herein. Similarly, RAID6 partial writes may require 3 internal read operations and 3 internal write operations, as described herein. Each read and write operation may require 4 KB blocks of data to be transferred over the storage system's internal dynamic random access memory (DRAM) bus or over the storage system's storage device fabric. Aspects of the present disclosure may reduce the DRAM and storage device fabric bandwidth utilization during RAID5 and RAID6 operations by compressing each 4 KB block into a compressed data. Bandwidth improvements are realized by performing the RAID5 and RAID6 internal read and write operations on the compressed data blocks. Storage systems implementing the systems and methods of the present disclosure may reduce bandwidth utilization by up to 8×.

Some features of the present disclosure may improve storage system performance during RAID5 and RAID6 full stripe writes. In a RAID5 storage system consisting of, for example, 3 storage devices plus one parity device, each stripe write may transfer four 4 KB blocks (one 4 KB block to each of the 3 storage devices, and one 4 KB block to the parity device). As with the partial stripe write, bandwidth utilization may be improved by compressing each 4 KB block before performing the stripe write, as described herein. However, because a full stripe write requires that the writes to each drive be the same size, aspects of the present disclosure pad each compressed data block with one or more sectors to ensure that each write operation writes the same number of sectors, as described herein. The one or more pad sectors added to each write may reduce the effective bandwidth seen by full stripe operations relative to partial stripe operations. However, a full stripe write transfers less data per unit of data actually written to the RAID stripe than a partial stripe write, so while the relative gains for a stripe write due to the present disclosure are less than those for a partial stripe write, they are still noteworthy and will result in a better overall efficiency.

Some features of the present disclosure may improve storage system performance during storage device read operations by reducing internal DRAM bandwidth utilization. An operation to read a single uncompressed 4 KB block may be executed by reading 4 KB (e.g., 8 sectors) from a storage device. Aspects of the present disclosure may be implemented to reduce DRAM bandwidth utilization by only transferring a number of compressed sectors representing the requested uncompressed 4 KB block to internal DRAM, as described herein. Unlike the write operations, storage device fabric utilization improvements may not be realized during reads because it may not be possible to determine whether a given 4 KB block is compressed less than 8 sectors until the an entire 4 KB block is read and associated metadata is interrogated. Consequently, for each 4 KB read request, 4 KB is read from the storage devices.

Aspects of the present disclosure may utilize skip write operations to execute reads and writes to storage devices that have gaps (e.g., one or more unused or unrequested drive sectors disposed between one more drive sectors that are targeted to be written or read). A skip mask associated with the skip write operation may indicate which drive sectors within contiguous block of sections should be written or read during a storage system operation.

Aspects of the present disclose may further improve the performance of storage systems having storage devices with firmware that may be modified to enable the storage device to be byte addressable. In these storage systems, rather than sending data that is rounded up (e.g., through padding) to integral number of sectors to a storage device, the storage system may transmit the exact byte count of the compressed data to the storage device. In addition for read operations, the storage system may issue a logical integer number of 4 KB reads, but the storage device drive would only transmit the exact byte count of the compressed data, with the drive returning to the storage system a list of compressed sizes for each 4 KB logical block. This aspect of the present disclosure may improve performance by reducing internal DRAM utilization and storage device fabric utilization.

Referring now to the figures, FIG. 1 depicts a flowchart 100 of a set of computer implemented operations for processing data in a RAID storage system in response to a data write request, according to various embodiments. The operations depicted in the flowchart 100 may be executed by hardware and/or software components of a data storage system or other computing device. In particular embodiments, the operations of flowchart 100 may be executed by a storage system controller on the behalf of a storage system. For example, the operations of flowchart 100 may be executed by the storage system controller 510 (FIG. 5) on the behalf of a RAID storage system. A storage system may execute computer executable code and/or actuate one or more electronic circuits to execute the operations described herein in response to request received from a host computing system to write a block of data to the storage system.

A storage system may begin the operations of flowchart 100 at operation 105 by executing a set of one or more internal (e.g., internal to the storage system) operations to receive a data block to write to the storage system. The storage system may receive the data block from a computing system through a computing system interface (e.g., a communication bus such as a Peripheral Component Interconnect, PCI, bus). The data block may be received as part of a storage system write request, and may include, in addition to the data block, information to enable the storage system to process and store the data block. In some embodiments, this information may include a logical or physical destination address for storing the data block on the storage system.

A storage system may execute operation 110 by compressing the received data block to generate a compressed data block. The compressed data block may include the received data block (e.g., host data) in compressed form and a data value (e.g., metadata) indicating that the data block is compressed. The data value may be a unit of data (e.g., a byte) having a specific value (e.g., 0xAA) and stored at an address (e.g., a relative address) in the compressed data block. In some embodiments, compression statistics including, for example, a compression ratio, may also be included in the compressed data block. The compressed data block may be generated by transferring the received data block to a compression engine. The compression engine may execute a set of logic operations to transform the received data block from its received form (e.g., an expanded form) to a compressed form. The set of logic operations may be an implementation of a compression algorithm such as a Lempel-Ziv, Huffman, and/or look-up table based compression or encoding algorithm. In some embodiments, the received data block may be retrieved from the computing system interface and transferred to the compression engine without storing or buffering the data block in the storage system's memory (e.g., without storing the data block in DRAM).

In certain embodiments, the storage system may compare the physical size of the received uncompressed data block to the physical size of the compressed data block. The storage system may store the compressed data block in memory (e.g., a nonvolatile or persistent memory) when the physical size of the received data block is greater (e.g., numerically larger) than the physical size of the compressed data block. Alternatively, the storage system may store the uncompressed received data block in memory when the physical size of the received data block is less than (e.g., numerically smaller) or equal to the physical size of the compressed data block.

A storage system may execute operation 115 by retrieving a compressed data block from a cache memory and storing it in a data buffer. The compressed data block may be retrieved in response to the execution of a set of internal operations to, for example, write the compressed data block to a RAID storage device (e.g., the compressed data blocks may be retrieved as part of a sequence of operations to execute a RAID destage operation).

A storage system may execute operation 120 by generating error detection and/or error correction redundant data based on the compressed data block retrieved in operation 115. The redundant data may be parity data for a single parity system (e.g., RAID 5 single parity data) or redundancy data for a dual redundant system (e.g., RAID 6 dual redundancy data). In certain embodiments, the redundant data may be generated by providing the compressed data block to a redundant data unit or engine to, for example, execute exclusive-OR or sum-of-products operations on the data to produce the redundant information.

A storage system may execute operation 125 by writing a compressed data block and corresponding redundant data to a RAID storage device. The storage system may write the compressed data block to a first RAID storage device by generating and executing a set of internal operations to transfer the compressed data block to a storage device interface (e.g., a Serial Attached Small Computer System Interface, SAS SCSI, bus and associated interface logic). The set of operations may additionally cause the storage device interface (and interface logic) to execute a set of operations to perform a partial and/or full stripe write to store the compressed data block on the first RAID storage device. Furthermore, the storage system may write the redundant data block to a second RAID storage device by generating and executing a second set of operations to transfer the compressed data block to the storage device interface. The second set of operations may be further executed to cause the storage device interface to execute a set of operations to perform a partial and/or full stripe write to store the redundant data to the second RAID storage device.

Figure 2:
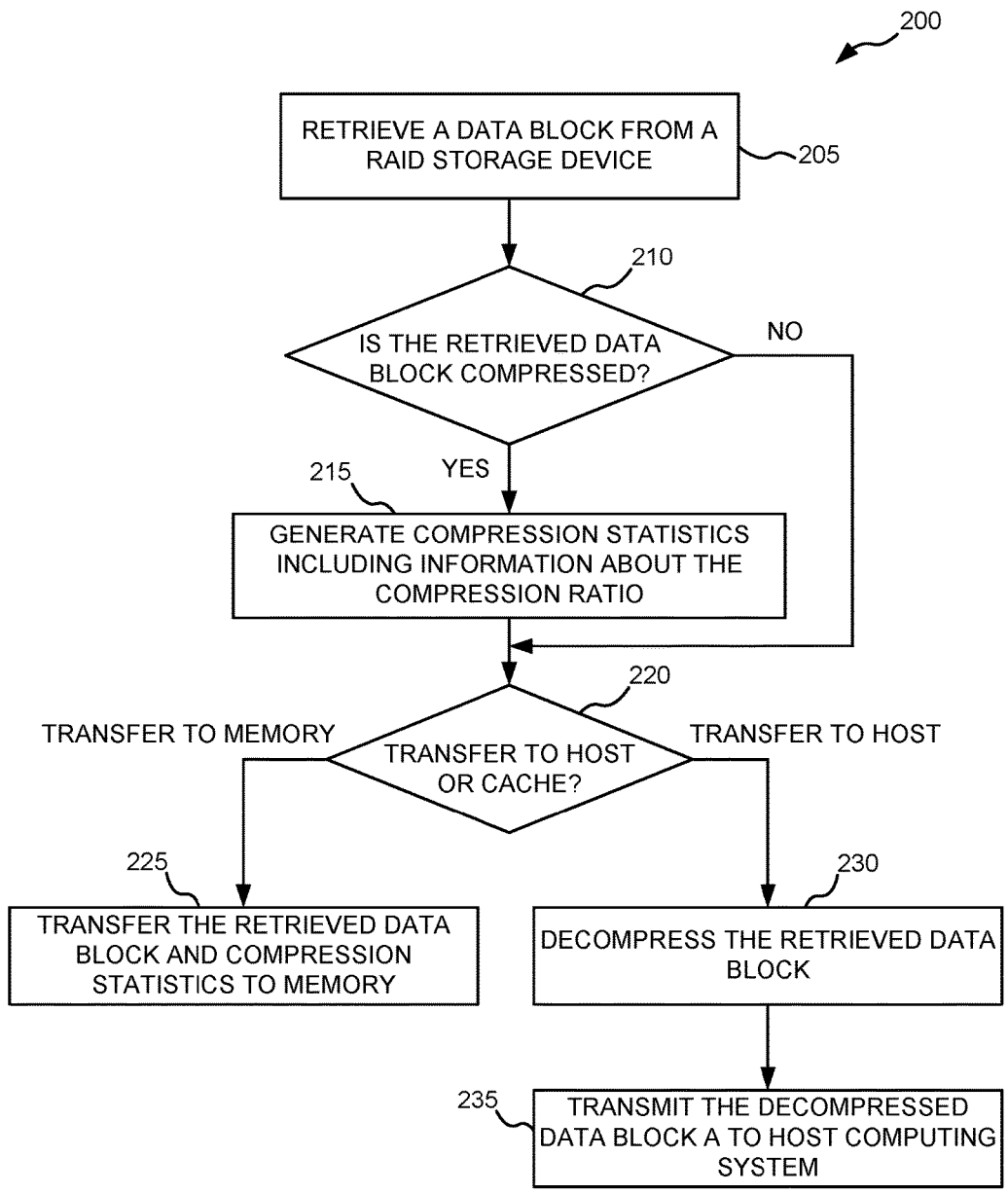
FIG. 2 depicts a flowchart of a set of computer implemented operations for processing compressed data retrieved from a RAID storage device, according to various embodiments.

FIG. 2 depicts a flowchart 200 of a set of computer implemented operations for processing compressed data retrieved from a RAID storage device, according to various embodiments. The operation of flowchart 200 may be executed to retrieve a compressed data block from a RAID storage device. The operations depicted in the flowchart 200 may be executed by hardware and/or software components of a data storage system or other computing device. In particular embodiments, the operations of flowchart 200 may be executed by a storage system controller on the behalf of a storage system. For example, the operations of flowchart 200 may be executed by the storage system controller 510 (FIG. 5) on the behalf of a RAID storage system. A storage system may execute computer executable code and/or actuate one or more electronic circuits to execute the operations described herein.

A storage system may execute operation 205 by executing a set of operations to cause a RAID storage device to transfer a compressed data block to a storage device interface associated with the storage system. The storage system may read the compressed data into a data compression-decompression engine. In some embodiments, the storage system may identify and remove pad data (including, for example, all data included that is not host data or metadata) from the compressed data block. The pad data may be identified by metadata or other markers (e.g., data delimiters or descriptors) included in the compressed data block. In some embodiments, the pad data may be identified based the compression algorithm used to generate the compressed data block. In other embodiments, the pad data may be identified by other data associated with the compressed data block and stored in the storage system. In another embodiment, the pad data may be identified and removed by the device, thus saving bandwidth on the device fabric.

The storage system may then cause the compression-decompression engine to determine whether the received data block includes compressed data (e.g., determine whether the received data block is a compressed data block), as indicated by operation 210. The data compression-decompression engine may determine that the received data block includes compressed data by, for example, identifying and decoding a data value inserted into the received data block during operation 110 of FIG. 1. The storage system may continue to operation 215, when the received data block is a compressed data block, while the storage system may proceed to operation 220 when the received data block is not a compressed data block.

The storage system may execute operation 215 by executing a set of operations to cause the data compression-decompression engine to generate compression statistics, based on the data block received in operation 205, for the storage system to use in cache memory management operations. The compression statistics may include information about the compressed data block's compression ratio. A compression ratio may be a data value indicating the ratio between the compressed data block's logical and physical size (e.g., compressed size). Compression statistics may additionally include the number of logical data blocks represented by, or compressed into, a single compressed data block. The cache memory management operations may include data mapping operations for mapping a computing system request for a logic data block to a compressed data block. The storage system, for example, may receive a request from a computing system to read a first logical data block. The first logical data block may be compressed, along with several other logical data blocks, into a single compressed data block. The compression statistics may enable the storage system (e.g., firmware executing on the storage system) to map the request for the first logical data block to a compressed data block, or to a logical data block within a compressed data block.

The storage system may execute operation 220 by determining whether the compressed data block retrieved from the RAID storage device in operation 205 is to be transmitted to a host computing system or transferred to cache memory. The storage system may determine, for example, that the compressed data block should be transmitted to a host computing system when the compressed data block is retrieved in operation 205 in response to, for example, a data read request from a host computing system for the compressed data block or for a logical data block compressed within the compressed data block. Alternatively, the storage system may determine that the compressed data block should be transferred to cache memory when the compressed data block is retrieved in response to executing one or more internal operations (e.g., cache management operations) or in response to receiving other requests from a computing system. In some embodiments, the storage system may determine that the compressed data block should be transferred to both a host computing system and to cache memory. The storage system continues to operation 225 when the compressed data block is to be transferred to cache memory, while the storage system may proceed to operation 230 when the compressed data block is to be transmitted to a host computing system.

A storage system may execute operation 225 by executing a set of one or more internal operations to transfer the compressed data block (e.g., in compressed form) retrieved in operation 205 from the compression-decompression engine to the storage system's cache memory. The compressed data block may be transferred to cache memory without the pad data identified in operation 215 (e.g., the compression-decompression engine may remove pad data from the compressed data block before the storage system transfers the compressed data block to cache). In some embodiments, the storage system may additionally transfer the compression statistics generated in operation 215 to cache memory. In other embodiments, the storage system may store the compression statics in a different memory associated with the storage system.

A storage system may execute operation 230 by executing a set of internal operations to decompress the compressed data block received in operation 205. The compressed data block may be decompressed by a decompression engine associated with the compression-decompression engine to generate a decompressed data block, as described herein. In some embodiments, the compressed data block may be decompressed by transferring the compressed data block (without pad data) to a decompression engine, where the decompression engine may execute a set of logic operations to transform the compressed data block from its compressed form to a decompressed or expanded form. The set of logic operations may be an implementation of a decompression algorithm corresponding with a compression algorithm used to compress the compressed data block.

The storage system may execute operation 235 by transmitting the decompressed data block generated in operation 230 to a host computing system. Transmitting the decompressed data block to a host computing system may include generating and executing a set of operations to transfer the decompressed data block from the decompression engine to a computing system interface (e.g., a PCI bus), and causing the computing system interface to execute a set of operations (or actuate one or more electronic circuits) to transmit the decompressed data block to the host computing system.

In various embodiments, a compressed data block may be retrieved from a RAID storage device, decompressed by a decompression engine to generate a decompressed logic block, and the decompressed data block may be transmitted to a host computing system without being buffered or cached in a memory of the storage system.

While an example embodiment of the operations of flowchart 200 is described herein, other variants of the flowchart 200 are contemplated. In some variants one or more operations of the flowchart 200 may be executed in a different order than indicated in FIG. 2. In other embodiments, additional operations may be added to further the execution of the operations of flowchart 200. In some embodiments, for example, the storage system may remove the pad data from a compressed data block destined for cache memory as part of operation 215 and remove pad data from a compressed data block destined for a host computing system as part of operation 230.

In another example, the RAID storage devices may be byte addressable storage devices, as described herein. In these embodiments, at operation 205, the storage system may transmit a read command to the RAID storage devices to read a set (e.g., one or more) of stored data blocks. The read command may indicate a logical size of the set of stored data blocks as a nonzero integer multiple of a computing system block size (e.g., 4 KB). The RAID storage device may then return a compressed data block including the requested stored data blocks in compressed form and long with a data structure (e.g., a list) indicating the compressed sizes of each stored data block. Because the RAID storage device is byte addressable, the compressed data block may not include pad data. Consequently, the steps of operation 205 to identify and remove the pad data may be bypassed in these embodiments. In some implementations, the data structure may be used in operation 205 to identify and discard data that was not the target of the read operation.

Figure 3:
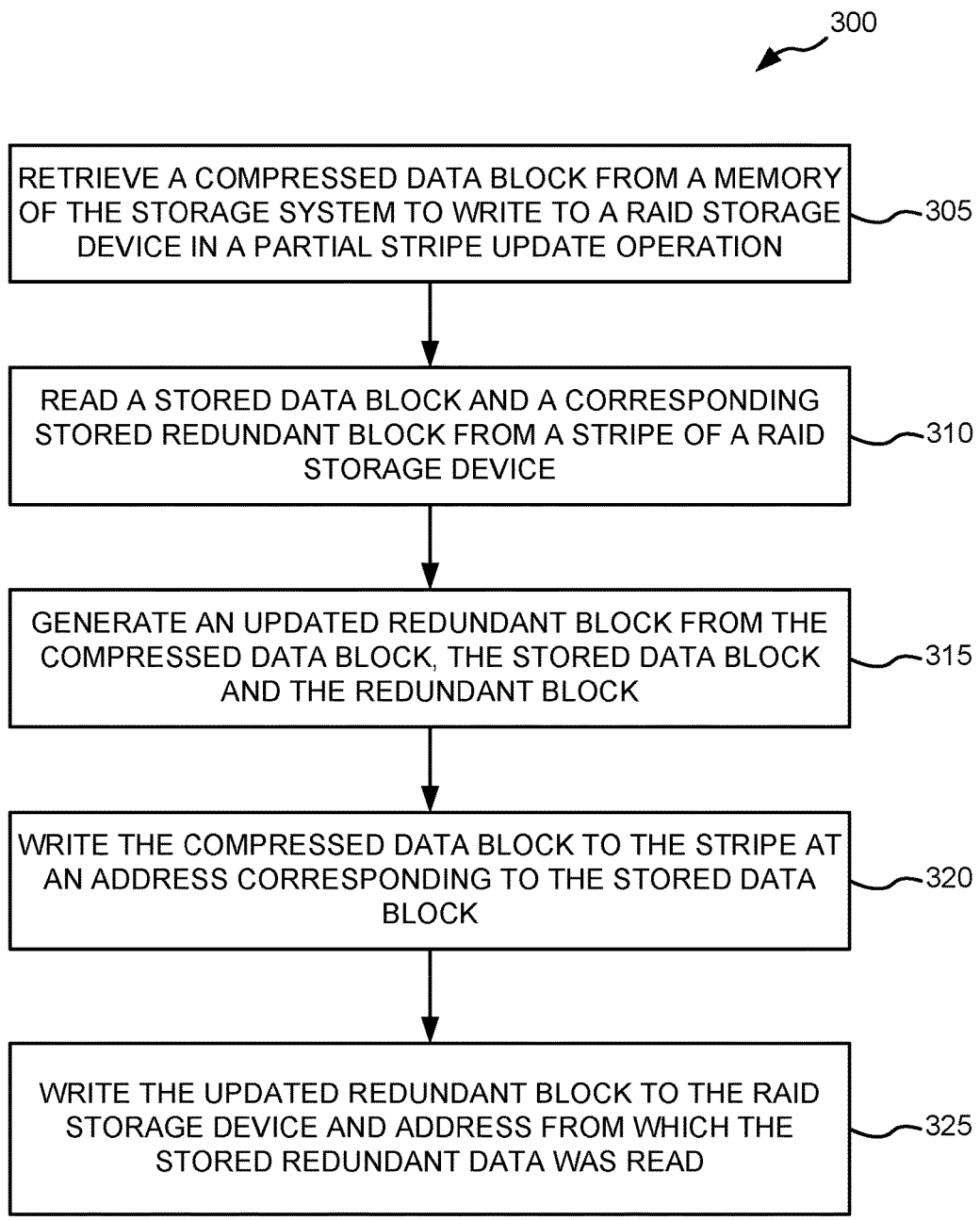
FIG. 3 depicts a flowchart of a set of computer implemented operations for executing a partial stripe to a RAID storage device using compressed data using compressed data in a RAID storage system, according to various embodiments.

FIG. 3 depicts a flowchart 300 of a set of computer implemented operations for executing a partial stripe write to a RAID storage device using compressed data, according to various embodiments. In some embodiments, the operations of flowchart 300 may be executed to write a set of compressed data blocks to a set of stripes on one or more RAID storage devices in a partial stripe write operation. A partial stripe write may include a write operation that replaces a portion of the data represented (or stored) in a stripe while leaving a remaining portion of the stripe data unmodified. The operations depicted in the flowchart 300 may be executed by hardware and/or software components of a data storage system or other computing device. In particular embodiments, the operations of flowchart 300 may be executed by a storage system controller on the behalf of a storage system.

In some embodiments, prior to executing the operations of flowchart 300, the RAID storage devices may be configured to receive in a read or write command a byte count. For a read operation, the byte count may indicate a specific number of bytes to read from the storage device and transfer to the storage controller over a storage system interface bus. For write operations, the byte count may indicate a specific number of bytes that the storage system will transfer over the storage interface bus to the RAID storage devices to execute the write operations.

A storage system may execute operation 305 by executing a set of operations to retrieve a compressed data block from a cache memory of the storage system. In some embodiments, the compressed data blocks may be retrieved while executing a sequence of operations to perform a RAID cache destage operation. The destage operation may cause the storage system to execute a partial stripe update of a RAID storage device using a compressed data block. The compressed data block may be transferred from cache memory to a buffer memory of the storage system.

A storage system may execute operation 310 by reading a stored data block corresponding with the compressed data block, retrieved in operation 305, from the RAID storage device. A stored data block may correspond with the compressed data block when the stored data block is stored on the storage device and at an address where the compressed data block will be written. In some embodiments, the storage system may retrieve the stored data block by executing a set of operations (e.g., SAS read or skip read operations) to read a stored data block of a particular size from a given address of a RAID storage device. The address may be the destination address on the RAID storage device for the compressed data block, while the particular size of the data block may be equal to the physical size of the compressed data block. The storage system may determine the physical size of the compressed data block by counting the number of bytes in the compressed data block. The storage system may further execute the set of operations to read a stored redundant data block corresponding with the stored data block. The stored redundant data block may correspond with a stored data block when the redundant data block includes only redundant data for the data in the stored data block. In some embodiments, the storage data block may be read from a different storage device than the stored data block.

The storage system may execute operation 315 by executing a set of operations to generate an updated redundant data block to replace the stored redundant data block. The set of operations may include logic operations to perform an exclusive-OR or a sum-of-products operation between the compressed data block, the stored data block, and the stored redundant data block. In some embodiments, other operations for generating an updated redundant data block may be executed. The result of the exclusive-OR or a sum-of-products operation may be an updated redundant data block for detecting and/or correcting errors in the compressed data block. In some embodiments, the physical size of the resulting updated redundancy data block will be the same as the compressed size of the new compressed data block, 305. In addition, the exclusive-OR or sum-of-products operation will be performed on the compressed data block and the redundancy data for the size of the compressed data block. Any redundancy data beyond the size of the compressed data block need not be updated as the size of the compressed data block limits the amount of redundancy data which must be updated, regardless of the size of the expanded logical data block.

The storage system may execute operation 320 by executing a set of operations to perform a partial stripe write with the compressed data block to a RAID storage device at a physical or logical address specified for the compressed data block. Executing the set of operations may cause the storage system to write the compressed data block start at the beginning of a data block in a stripe specified by the compressed data block's destination address. Executing the set of operations may further cause the storage system to write the compressed data block to the RAID storage device without modifying the stored data outside of the storage area specified for the compressed data block. The storage area may be specified by the destination address and the physical size of the compressed data block. For example, when a compressed data block having a physical size of 3 KB is used to update a logical block representing 4 KB of data on a RAID storage device, executing the set of operations may cause the storage system to write the 3 KB compressed data block to the first 3 KB of the stripe, while leaving the remaining 1 KB unmodified.

The storage system may execute operation 325 by executing a set of operations to perform a partial stripe write with the redundant data block to a RAID storage device and at the physical or logical address from which the stored redundant data block was retrieved. Executing the set of operations may cause the storage system to write the updated redundant data block to the RAID storage device without modifying the stored data outside of the storage area of the newly written redundant data block, possibly leaving some of the previous redundant data block on this RAID storage device.

In various embodiments, the set of operations to perform a partial stripe write of the compressed data block and the redundant data may include a SAS skip-operation (skip-op). The skip-op allows a read or write of a subset of data blocks within a range of data blocks by using a mask to specify which blocks are to be included in the read or write and which blocks are to be masked or excluded from the op. The skip-op may be executed to perform the operations of block 310 to retrieve, from the storage device, the data blocks and redundant data blocks used to generate the updated redundancy data block without transferring the masked (unnecessary) data blocks. Also, the skip-op may be executed to perform 320, to write to, a specified unmasked address in, or portion of, a stripe of the RAID storage device without modifying data at masked addresses.

In some embodiments, the set of operations to perform a partial stripe write of the compressed data block and the redundant data may include transmitting a write command having a byte count to a RAID storage device that is configured be byte addressable. Byte addressable storage devices may be configured to receive data and corresponding byte counts that are not integer multiples of the a storage system's sector size (e.g., the ratio of the physical size of the compressed data block to be written in bytes to a size in bytes of a storage system sector includes a nonzero fractional portion) and write the exact amount of data specified by the byte count to storage at a designated address.

While an example embodiment of the operations of flowchart 300 is described herein, other variants of the flowchart 300 are contemplated. In some variants one or more operations of the flowchart 300 may be executed in a different order than indicated in FIG. 3. In other embodiments, additional operations may be added to further the execution of the operations of flowchart 300. In some embodiments, for example, the storage system may execute a set of operations for reading a set of two or more data blocks and corresponding redundant data blocks, each data block stored at a location on a set of RAID storage devices that will be updated by a set of compressed data blocks retrieved from cache memory. In these embodiments, the set of two or more data blocks may not occupy a contiguous address space (e.g., one or more stored blocks, that are not being read, may be interspersed between the set of data blocks that are being read). Executing the set of operations may further cause the storage system to receive a mask for enabling the storage system to overwrite the set of two or more stored data blocks and corresponding redundant data blocks with a set of buffered (or cached) compressed data blocks and corresponding updated redundant data blocks without modifying the interspersed data blocks.

Figure 4:
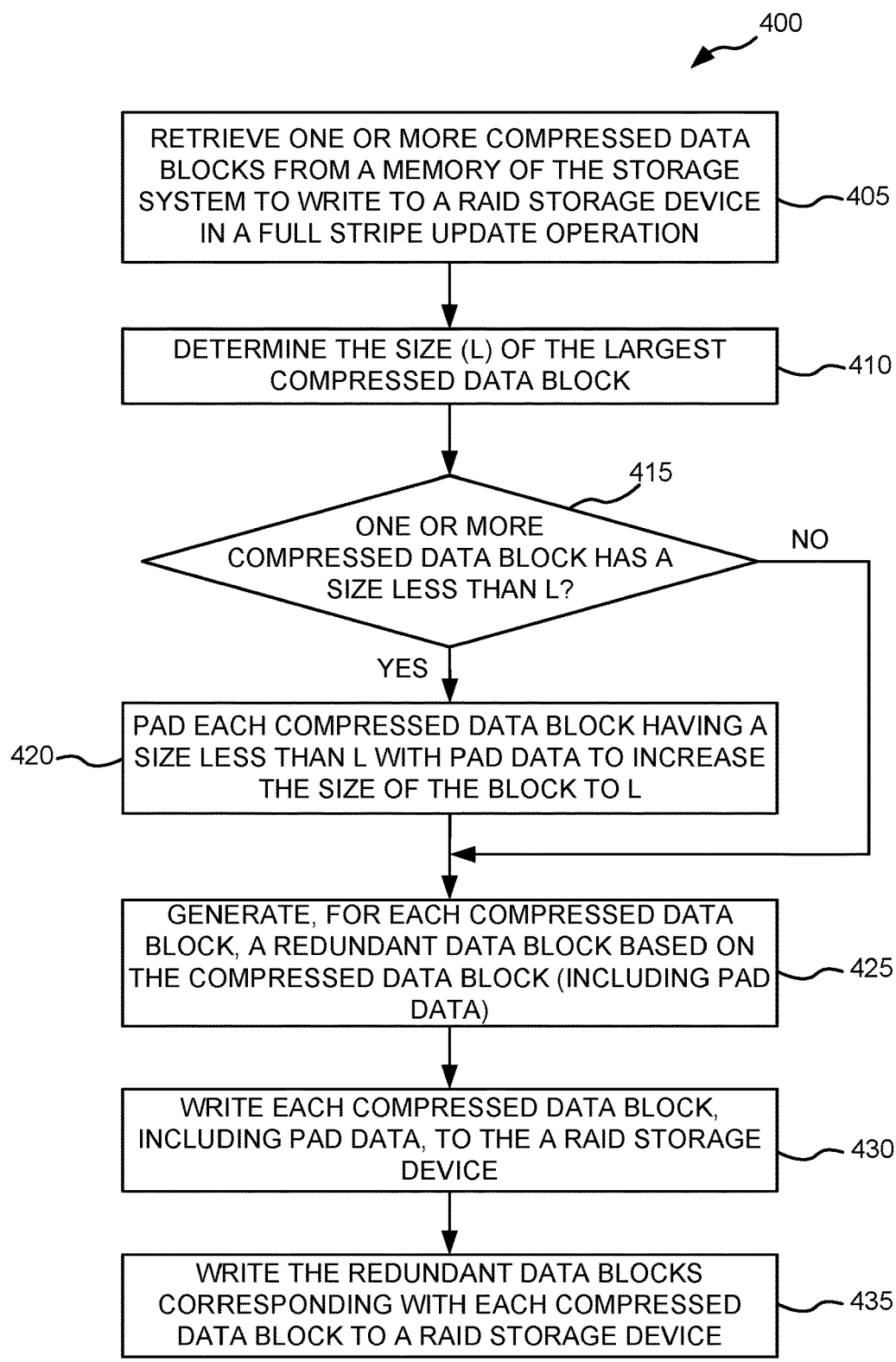
FIG. 4 depicts a flowchart of a set of computer implemented operations for executing a full stripe update using compressed data in a RAID storage system, according to various embodiments.

FIG. 4 depicts a flowchart 400 of a set of computer implemented operations for executing a full stripe write on a set of RAID storage devices using compressed data, according to various embodiments. A full stripe write may include a write operation that replaces the data blocks associated with a stripe with a set of new compressed data blocks. The operations depicted in the flowchart 400 may be executed by hardware and/or software components of a data storage system or other computing device. In particular embodiments, the operations of flowchart 400 may be executed by a storage system controller on the behalf of a storage system.

A storage system may execute operation 405 by executing a set of operation to retrieve one or more compressed data blocks from a cache memory of the storage system. In some embodiments, the compressed data blocks may be retrieved while executing a RAID cache destage operation. The destage operation may cause the storage system to execute a full stripe write to a set of RAID storage devices using the compressed data blocks. The compressed data blocks may be transferred from cache memory to a buffer memory of the storage system.

The storage system may execute operation 410 by determining the size (L) of the largest retrieved compressed data bock. The size of the largest compressed data block may be a count of the number of data units making up the physical size of largest compressed data block. The storage system may determine the size of a compressed data block by reading metadata associated with the compressed data block indicating the size of the compressed data block. The storage system may also determine the size of a compressed data block by calculating the number of data units required to store the compressed data block. The storage system may further determine the size of a compressed data block by retrieving the size from a table stored in a memory of the storage controller.

The storage system may execute operation 415 by executing a set of operations to determine whether one or more of the compressed data blocks retrieved in operation 405 has a physical size that is less than the size of the largest compressed data block (e.g., a physical size that is less than L). The storage system may continue to operation 420 when the physical size of at least one compressed data block is less than L, while the storage system may proceed to operation 425 when none of the compressed data blocks have a physical size less than L.

The storage system may execute operation 420 by executing a set of operations to pad each compress data block having a physical size less than L. A compressed data block may be padded by adding a one or more of data units of pad data to the compressed data block. In some embodiments, the amount of pad data added to the compressed data block may be equal to the difference between L and the size of the compressed data block. When the size of the largest compressed data block is 4 KB, for example, a compressed data block having a physical size of 3 KB may be padded with 1 KB of pad data to increase its physical size to 4 KB. The resulting padded compressed data block may include compressed data and pad data. The pad data may be an array of data values, such as, an array of zeros. In some embodiments, the pad data may be retrieved from a memory of the storage system and physically added to the compressed data block. In other embodiments, the compressed data block may be logically padded by configuring data descriptors associated with the compressed data block to cause the storage system to represent or interpret the compressed data block as a data block having a size L, with the data occupying the space between the physical size of the compressed data block and L as an array of pad data (e.g., zeros).

The storage system may execute operation 425 by generating a redundant data bock for each compressed data block (or each padded compressed data block). When the compressed data block includes pad data, the redundant data block may correspond with (e.g., may be based on or generated from) the compressed data in the compressed data block and the pad data. The redundant data block may be generated by transferring the compressed data block to a redundant data engine or circuit for generating redundant data. In a RAID 5 storage system, for example, the compressed data block (including pad data) may be transferred to an exclusive-OR (XOR) engine. The XOR engine may read the compressed data block and execute a set of XOR operations on the included data to generate a redundant data block. As a second example, RAID 6 storage systems may provide the compressed data block (including pad data) to a Sum-of-Products (SOP) engine. The SOP engine may read the compressed data block and execute a set of SOP operations on the included data to generate a redundant data block. In some embodiments, the storage system may provide pad data to the redundant data engines (e.g., the XOR engine and the SOP engine) by actuating one or more electronic circuits to interpret pad data descriptors to generate and provide the pad data.

The storage system may continue the operations of flowchart 400 at operation 430 by executing a set of operation to perform a full stripe write to a set of RAID storage devices using the compressed data blocks, including pad data, retrieved in operation 405. The set of operations may be executed to cause the storage system to transfer the compressed data blocks (including pad data) to the storage device interface (e.g., to a dynamic memory access engine associated with the storage device interface). In some embodiments, rather than transferring the pad data from the storage system's memory, one or more logic circuits may interpret pad data descriptors associated with the compressed data blocks to generate and provide the pad data to the storage device interface. The set of operations may be further executed to cause the storage device interface to transmit the set of data blocks and pad data to the set of RAID storage devices. The compressed data block and pad data may be written to data blocks associated with a stripe and located at a physical or logical address specified for the compressed data blocks.

The storage system may continue the operations of flowchart 400 at operation 435 by executing a set of operation to perform a full stripe write to one or more RAID storage devices for storing redundant data (hereinafter, "redundant data device") using the set of redundant data blocks generated in operation 425. The set of operations may be executed to cause the storage system to transfer the set of redundant data blocks to the storage device interface (e.g., to a dynamic memory access engine associated with the storage device interface). The set of operations may be further executed to cause the storage device interface to transmit and write the set of redundant data blocks to the redundant data device. In this embodiment, the size of each set of compressed data and pad, as well as each set of redundant data generated from the compressed data and pad, may be equal to the size of the largest compressed data, L. The difference between L and the logical size of the data blocks is left unchanged on the RAID storage devices.

While an example embodiment of the operations of flowchart 400 is described herein, other variants of the flowchart 400 are contemplated. In some variants one or more operations of the flowchart 400 may be executed in a different order than indicated in FIG. 4. In other embodiments, additional operations may be added to further the execution of the operations of flowchart 400.

Figure 5:
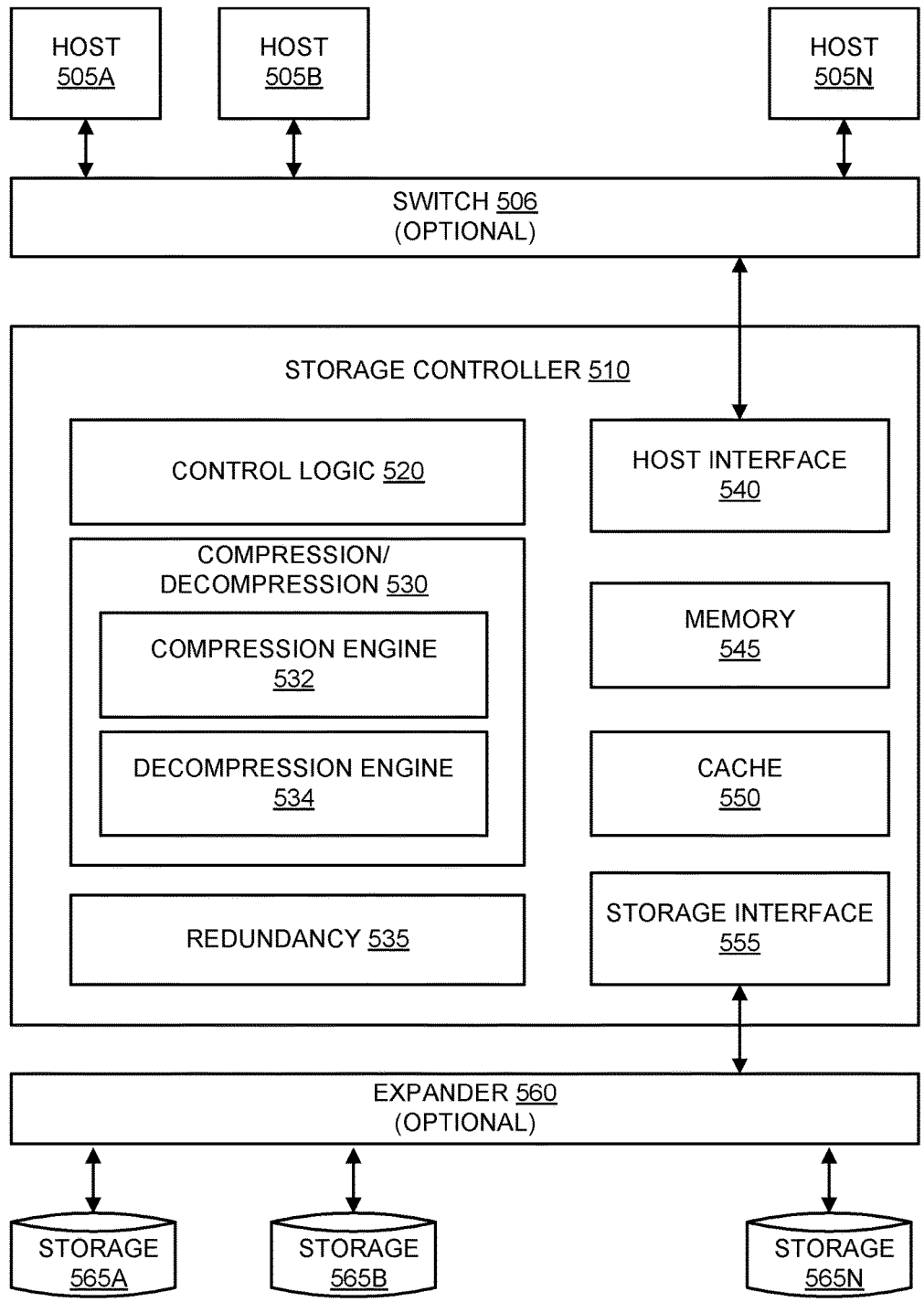
FIG. 5 depicts a block diagram of a computing environment having a RAID storage system configured to implement the operations of the present disclosure, according to various embodiments.

FIG. 5 depicts a block diagram of a computing environment having a RAID storage system configured to implement the operations of the present disclosure, according to various embodiments. The computing environment may include computing systems 505A-505N, switch 506, RAID storage controller 510, expander 560, and RAID storage devices 565A-565N. In certain embodiments, the RAID storage controller 510 and RAID storage devices 565A-565N may form a RAID storage system, as described herein. In other embodiments, the RAID storage system may further include the host computing systems 505A-505N, the switch 506 and the expander 560. The computing systems 505A-505N may be host computing system having a data communication bus (e.g., a PCI, or PCI express, bus) for interfacing with the storage controller 510. The optional switch 506 may be a communication bus switch (e.g., a PCI express switch) configured to couple one or more host computing systems 505A, 505B, and 505N to the storage system 510. Similarly, the optional expander 560 may be a storage bus expander coupling one or more storage devices 565A-565N to the storage controller 510.

The storage controller 510 may include control logic 520, compression-decompress engine 530, redundancy engine 535, host interface 540, memory 545, cache memory 550, and storage interface 555. The controller 510 may be configured to receive and process data access requests from, e.g., host computing systems 505A-505N. The data access requests may include requests to write data blocks to, and read data blocks from, RAID storage devices 565A-565N. The storage controller 510 may include firmware, logic circuits, and other programmable and configurable devices for orchestrating the interactions of the components of the storage controller 510 and to implement the operations of the present disclosure.

In some embodiments, logic unit 510 may be an integrated circuit (IC) such as an application specific IC, a microcontroller, or a field programmable gate array. In other embodiments, the logic unit 510 may include a set of two or more integrated circuits.

The control logic unit 520 may include programmable and/or configurable logic circuits (e.g., an application specific IC, a microcontroller, a microprocessor, a field programmable gate array) for causing the storage system to execute the operations of the present disclosure. Control logic 520, for example, may include logic circuits for executing firmware code to cause the storage system to retrieve a data block from host interface 540, compress the data block using compression-decompression engine 530, and write the compressed data block to cache memory 550 or the buffer memory 545. The control logic 520 may further execute firmware code to retrieve a compressed data block from memory 550 (or memory 545), generate redundant data corresponding with the compressed data block, and transmit the compressed data block and redundant data to storage device interface 555 for writing to storage device 565A-565N.

The compression-decompression engine 530 may include compression engine 532 and decompression engine 534. The compression-decompression engine may be configured to compress data blocks received from the host computing systems 505A-505N, decompressing data blocks for transmission to the host computing systems 505A-505N, and for generating compression statics corresponding with generated compressed data blocks or data blocks retrieved from the storage devices 565A-565N.

The compression engine 532 may receive an uncompressed data block from host computing system interface logic 540. The compression engine 532 may execute firmware code and/or to actuate one or more electronic circuits to execute a data compression algorithm to generate a compressed logic block from the uncompressed logic block. The compression engine may further execute firmware and/or actuate one or more electronic circuits to generate compression statistics about the compressed logic block. The compression statistics may include, for example, a compression ratio, a count of the number of logical data blocks that were compressed into in the compressed data block, and count of the number units of data required to store the compressed logic block (e.g., the physical size of the compressed logic block). In certain embodiment, the compression statistics maybe generated from a compressed logic block received from a RAID storage device. In some embodiments, the compression statistics may be added to, or be inserted into, the compressed data block. In other embodiments, the compression statistics may be stored in a memory of the storage controller 510 (e.g., memory 545 or cache memory 550). The compression engine may provide the compressed logic block to memory 545 or cache 550.

The decompression engine 534 may be configured to execute firmware code and/or to actuate one or more electronic circuits to decompress a compressed logic block before transmitting it to a host computing system 505A. The decompression engine 534 may receive a compressed data block from the memory 545, the cache memory 550, and from the RAID storage devices 565A-565N. In some embodiments, the RAID storage devices 565A-565N may not generate (or maintain) tables or other data having compression information about a stored compressed logic block. Similarly, the storage system 510 may not generate (or maintain) tables or other data having compression information about cached or buffered compressed logic block. The decompression engine 534 may, consequently, retrieve compression information (e.g., compression statistics) about a compressed logic block by examining the compressed logic block. The decompression engine 534 may decompress the compressed logic block based on the retrieved compression information. The decompression engine 534 may then forward the decompressed logic block to host computing system 505A-505N via host interface 540. In various embodiments, the decompressed logic block may be forwarded to the host computing system without being buffered or stored in the memory 545.

The memory 545 may include both nonvolatile memory (e.g., FLASH memory) and volatile memory (e.g., RAM, DRAM, SDRAM, SRAM). The memory 545 may be used as a buffer memory to store, for example, data, commands or other information to enable the storage controller 510 to execute the operations of the present disclosure. The memory 545, may additionally store compressed data blocks and redundant data while they are being operated on by the storage controller 510.

The cache memory 550 may be nonvolatile or persistent memory such as FLASH or FLASH backed DRAM. In some embodiments, the memory 550 may store compressed data blocks before they are written storage devices 565A-565N.

The host interface unit 540 may include digital and analog electronic circuits for exchanging data and control blocks between the storage controller 510 and host computing system 505A-505N. The host interface unit 540 may receive, via a host data communication bus (e.g., a PCI bus), uncompressed data blocks from host computing systems 505A-505N for writing to storage devices 565A-565N. The host interface unit 540 may execute a set of logic operations to transfer the uncompressed data block to compression-decompression engine 530 for processing. In some embodiments, the host interface unit 540 may further receive an uncompressed data block from compression-decompression unit 530 and execute a set of logic operations to transmit the uncompressed data block to host computing system 505A-505N. In certain embodiments, the exchange of decompressed data blocks between the host computing system 505A-505N and compression-decompression engine 530 may be executed without buffering or storing the decompressed data block in the memory 545 or the cache memory 550.

The storage interface unit 555 may include digital logic and analog electronic circuits for exchanging data and control signals between the storage controller 510 and the RAID storage devices 565A-565N. The storage interface unit 555 may execute a set of logic operations to receive, via storage system data communications bus (e.g., an SAS bus), compressed data blocks from the RAID storage devices 565A-565N for writing to the memory 545 (and cache memory 550) or for transmitting to the host computing systems 505A-505N. The storage interface unit 555 may transfer the received compressed data blocks to compression-decompression engine 530 for processing. In some embodiments, the storage interface 555 may execute a set of logic operations to receive a compressed data block and associated redundant data from the memory 545, and to transmit the received blocks to the storage devices 565A-565N. In some embodiments, the storage interface unite 555 may include an SAS controller. In these embodiments, the set of operations executed by the storage interface 555 may be a set of SAS commands.

The RAID storage devices 565A-565N may be a set of one or more RAID storage devices. In some embodiments, the RAID storage devices may be configured to store data in stripes distributed across one or more of the RAID storage devices. The RAID storage devices may further be configured to write data to, and read data from, a stripe in blocks of data of a specified size (e.g., 4 KB and 512 B blocks). For example, when the RAID storage device is configured to operate on 4 KB blocks, a write operation may include receiving a 4 KB block from the storage controller 510 and writing the entire 4 KB block to the stripe. The RAID storage devices may be further configured to operate on blocks of data that have a physical size less than the specified stripe block size by implementing operations (e.g., skip-ops) that enable a portion of a stored data block to be protected by a mask. Extending the present example, a RAID storage device may write a 3 KB block to a 4 KB stripe block using a skip-op that masks the highest 1 KB of the stripe block.

In some embodiments, the RAID storage devices 565A-565N may be configured to operate on data blocks of arbitrary size (e.g., the storage devices may be byte addressable). In these embodiments, data blocks of arbitrary length may be written to, or read from, the RAID storage devices without the use of skip-ops. Configuring the RAID storage devices to be byte addressable may include modifying the firmware of the RAID storage devices to enable the RAID storages devices to map a logical block address to a compressed data block (e.g., to determine which logical blocks are stored in a compressed data block) and to map compressed data block to a physical block address. To accomplish this, the modified firmware may include components of the compression algorithms used by the storage system.

In various embodiments, the RAID storage devices 565A-565N may include a set of data storage devices and a set of redundant data storage devices. The data storage devices may store compressed data received from host computing system 505A-505N. The redundant data storage device may store redundant data generated to detect and correct errors in data blocks stored on the data storage devices. As an example, a RAID 5 storage system may include three data storages devices and one associated redundant data storage device. Similarly, RAID 6 storage systems may implement double parity systems where three data storage devices are associated with two redundant data devices. In another embodiment, the designation of a data storage device and a redundant storage device may change depending on the address. For example, a data device for one stripe may be the redundant storage device for another stripe.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A method for operating a storage system, the storage system having memory and RAID storage devices, comprising:
    receiving, from a computing system, a first data block to write to the storage system;
    compressing the first data block to generate a second data block, the second data block including the first data block in compressed form and a data value, the data value indicating that the second data block is compressed, wherein the compressing is done before storing the first data block in the memory;
    comparing a physical size of the first data block to a physical size of the second data block;
    storing the second data block in the memory in response to determining that the physical size of the first data block is greater than the physical size of the second data block; and
    executing a set of RAID operations to write the second data block to a stripe of the RAID storage devices, the set of operations including:
        retrieving one or more compressed data blocks from the memory, the one or more compressed data blocks comprising at least the second data block;
        determining a size of a largest compressed data block, the largest compressed data block being from the one or more compressed data blocks;
        generating a particular padded data block for each of the particular compressed data blocks by padding each of the particular compressed data blocks with zero or more units of pad data to cause a size of each particular padded data block to equal the size of the largest compressed data block;
        generating, for each particular padded data block, a particular redundant data block for performing at least one of an error detection and an error correction operation on each particular padded data block;
        writing each particular padded data block to the RAID storage devices by generating and executing a set of internal operations to transfer each particular padded data block to a storage device interface and to replace data blocks associated with a stripe with each particular padded data block, wherein one or more logic circuits of the storage system interpret pad data descriptors associated with the each particular padded data block and provide the pad data of the each particular padded data block to the storage device interface without transferring the pad data from the memory; and
        writing each particular redundant data block to the RAID storage devices by executing a set of internal operations to transfer each particular redundant data block to the storage device interface and to perform a full stripe write to the RAID storage devices using each particular redundant data block.

2. The method of claim 1, further comprising:
    retrieving a third data block from the RAID storage devices;
    determining that the third data block is compressed by identifying, in the third data block, a data value indicating that the third data block is compressed;
    generating compression statistics for the third data block, the compression statistics including a compression ratio; and
    storing the third data block in the memory.

3. The method of claim 2, further comprising:
    determining that the third data block is padded with pad data; and
    discarding, in response to determining that the third data block is padded, the pad data before storing the third data block in the memory.

4. The method of claim 3, wherein the third data block is a particular padded data block.

5. The method of claim 1, further comprising:
    retrieving a third data block from the RAID storage devices;
    determining that the third data block is compressed by identifying, in the third data block, a data value indicating that the third data block is compressed;
    decompressing the third data block to generate a decompressed data block, wherein the decompressing includes discarding pad data included in the third data block; and
    transmitting the decompressed data block to the computing system.

6. The method of claim 1, wherein the RAID storage devices is byte addressable.

7. The method of claim 1, further comprising:
transferring each particular padded data block and each particular redundant data block to the RAID storage devices over a serial attached small computer system interface data bus.

8. The method of claim 1, wherein the memory is at least one of RAM, DRAM, SDRAM, SRAM and flash.

9. The method of claim 1,
wherein the size of a compressed data block is a number of data units required to represent the compressed data block in a memory of the storage system.

10. A storage system, comprising:
a set of one or more RAID storage devices;
a storage controller having a processor and a memory, the memory having program instructions embodied therewith, the program instructions executable by the processor to cause the storage controller to:
receive, from a computing system, a first data block to write to the storage system;
compress the first data block to generate a second data block, the second data block including the first data block in compressed form and a data value, the data value indicating that the second data block is compressed, wherein the compressing is done before storing the first data block in the memory;
compare a physical size of the first data block to a physical size of the second data block;
store the second data block in the memory in response to determining that the physical size of the first data block is greater than the physical size of the second data block; and
execute a set of RAID operations to write the second data block to a stripe of the RAID storage devices, the set of operations to:
retrieve one or more compressed data blocks from the memory, the one or more compressed data blocks comprising at least the second data block;
determine a size of a largest compressed data block, the largest compressed data block from the one or more compressed data blocks;
generate a particular padded data block for each of the particular compressed data blocks by padding each of the particular compressed data blocks with zero or more units of pad data to cause a size of each particular padded data block to equal the size of the largest compressed data block;
generate, for each particular padded data block, a particular redundant data block for performing at least one of an error detection and an error correction operation on each particular padded data block;
write each particular padded data block to the RAID storage devices by generating and executing a set of internal operations to transfer each particular padded data block to a storage device interface and to replace data blocks associated with a stripe with each particular padded data block, wherein one or more logic circuits of the storage system interpret pad data descriptors associated with the each particular padded data block and provide the pad data of the each particular padded data block to the storage device interface without transferring the pad data from the memory; and
write each particular redundant data block to the RAID storage devices by executing a set of internal operations to transfer each particular redundant data block to the storage device interface and to perform a full stripe write to the RAID storage devices using each particular redundant data block.

11. The storage system of claim 10, program instructions executable by the processor to further cause the storage controller to:
retrieve a third data block from the RAID storage devices;
determine that the third data block is compressed by identifying, in the third data block, a data value indicating that the third data block is compressed;
generate compression statistics for the third data block, the compression statistics including a compression ratio; and
store the third data block in the memory.

12. The storage system of claim 11, program instructions executable by the processor to further cause the storage controller to:
determine that the third data block is padded with pad data; and
discard, in response to determining that the third data block is padded, the pad data before storing the third data block in the memory.

13. The storage system of claim 10, program instructions executable by the processor to further cause the storage controller to:
retrieve a third data block from the RAID storage devices;
determine that the third data block is compressed by identifying, in the third data block, a data value indicating that the third data block is compressed;
decompress the third data block to generate a decompressed data block, wherein the decompressing includes discarding pad data included in the third data block; and
transmit the decompressed data block to the computing system.

14. The storage system of claim 10, wherein the RAID storage devices is byte addressable.

15. The storage system of claim 10, program instructions executable by the processor to further cause the storage controller to:
transfer each particular padded data block and each particular redundant data block to the RAID storage devices over a serial attached small computer system interface data bus.

16. The storage system of claim 10, wherein the memory is at least one of RAM, DRAM, SDRAM, SRAM and flash.

17. A computer program product for operating a storage system having memory and RAID storage devices, the computer program product including a computer readable storage medium having program instructions embodied therewith, wherein the computer readable storage medium is not a transitory signal per se, the program instructions executable by a processing circuit to cause the processing circuit to perform a method comprising:
receiving, from a computing system, a first data block to write to the storage system;
compressing the first data block to generate a second data block, the second data block including the first data block in compressed form and a data value, the data value indicating that the second data block is compressed, wherein the compressing is done before storing the first data block in the memory;
comparing a physical size of the first data block to a physical size of the second data block;

storing the second data block in the memory in response to determining that the physical size of the first data block is greater than the physical size of the second data block; and executing a set of RAID operations to write the second data block to a stripe of the RAID storage devices, the set of operations including:

retrieving one or more compressed data blocks from the memory, the one or more compressed data blocks comprising at least the second data block;

determining a size of a largest compressed data block, the largest compressed data block from the one or more compressed data blocks;

generating a particular padded data block for each of the particular compressed data blocks by padding each of the particular compressed data blocks with zero or more units of pad data to cause a size of each particular padded data block to equal the size of the largest compressed data block;

generating, for each particular padded data block, a particular redundant data block for performing at least one of an error detection and an error correction operation on each particular padded data block;

writing each particular padded data block to the RAID storage devices by generating and executing a set of internal operations to transfer each particular padded data block to a storage device interface and to replace data blocks associated with a stripe with each particular padded data block, wherein one or more logic circuits of the storage system interpret pad data descriptors associated with the each particular padded data block and provide the pad data of the each particular padded data block to the storage device interface without transferring the pad data from the memory; and writing each particular redundant data block to the RAID storage devices by executing a set of internal operations to transfer each particular redundant data block to the storage device interface and to perform a full stripe write to the RAID storage devices using each particular redundant data block.

18. The computer program of claim 17, the method further comprising:

retrieving a third data block from the RAID storage devices;

determining that the third data block is compressed by identifying, in the third data block, a data value indicating that the third data block is compressed;

generating compression statistics for the third data block, the compression statistics including a compression ratio; and storing the third data block in the memory.

19. The computer program of claim 18, the method further comprising:

determining that the third data block is padded with pad data; and discarding, in response to determining that the third data block is padded, the pad data before storing the third data block in the memory.

20. The computer program of claim 17, the method further comprising:

retrieving a third data block from the RAID storage devices;

determining that the third data block is compressed by identifying, in the third data block, a data value indicating that the third data block is compressed;

decompressing the third data block to generate a decompressed data block, wherein the decompressing includes discarding pad data included in the third data block; and transmitting the decompressed data block to the computing system.

* * * * *